United States Patent
Franklin et al.

(10) Patent No.: US 11,560,626 B2
(45) Date of Patent: Jan. 24, 2023

(54) SUBSTRATE PROCESSING CHAMBER

(71) Applicant: Applied Materials, Inc., Santa Clara, CA (US)

(72) Inventors: Timothy Joseph Franklin, Campbell, CA (US); Adam Fischbach, Campbell, CA (US); Edward Haywood, Santa Clara, CA (US); Abhijit B. Mallick, Fremont, CA (US); Pramit Manna, Santa Clara, CA (US); Carlaton Wong, Sunnyvale, CA (US); Stephen C. Garner, Newark, CA (US); Eswaranand Venkatasubramanian, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/876,845

(22) Filed: May 18, 2020

(65) Prior Publication Data
US 2020/0370177 A1  Nov. 26, 2020

Related U.S. Application Data

(60) Provisional application No. 62/888,666, filed on Aug. 19, 2019, provisional application No. 62/852,723, filed on May 24, 2019.

(51) Int. Cl.
*C23C 16/458* (2006.01)
*H01J 37/32* (2006.01)
(Continued)

(52) U.S. Cl.
CPC .... *C23C 16/4584* (2013.01); *C23C 16/45565* (2013.01); *C23C 16/46* (2013.01);
(Continued)

(58) Field of Classification Search
CPC ............. H01J 37/3244; H01J 37/32522; H01J 37/32715; H01J 2237/3321;
(Continued)

(56) References Cited

U.S. PATENT DOCUMENTS 8,361,906 B2   1/2013   Lee et al.
9,520,295 B2  12/2016   Shaikh et al.
(Continued)

FOREIGN PATENT DOCUMENTS

EP          0855452        7/1998
KR   10-2012-0121340 A   11/2012
(Continued)

OTHER PUBLICATIONS

International Search Report and Written Opinion for Application No. PCT/US2020/033377 dated Sep. 1, 2020.
(Continued)

*Primary Examiner* — Yuechuan Yu
(74) *Attorney, Agent, or Firm* — Patterson + Sheridan, LLP

(57) ABSTRACT

Embodiments of the present disclosure generally relate to apparatus and methods utilized in the manufacture of semiconductor devices. More particularly, embodiments of the present disclosure relate to a substrate processing chamber, and components thereof, for forming semiconductor devices.

14 Claims, 13 Drawing Sheets

(51) Int. Cl.
  *C23C 16/46* (2006.01)
  *C23C 16/50* (2006.01)
  *C23C 16/455* (2006.01)
  *H01L 21/02* (2006.01)
  *H01L 21/033* (2006.01)

(52) U.S. Cl.
  CPC .......... *C23C 16/50* (2013.01); *H01J 37/3244* (2013.01); *H01J 37/32522* (2013.01); *H01J 37/32715* (2013.01); *H01J 2237/3321* (2013.01); *H01L 21/02115* (2013.01); *H01L 21/02274* (2013.01); *H01L 21/0332* (2013.01)

(58) Field of Classification Search
  CPC ......... H01L 21/68785; H01L 21/68742; H01L 21/6831; H01L 21/67109; H01L 21/6719; H01L 21/68792; H01L 21/02115; H01L 21/02274; H01L 21/0332; C23C 16/4586; C23C 16/50; C23C 16/26; C23C 16/4584; C23C 16/45565; C23C 16/505; C23C 16/46
  See application file for complete search history.

(56) References Cited

U.S. PATENT DOCUMENTS

| | | | |
|---|---|---|---|
| 10,249,495 B2 | 4/2019 | Yang et al. | |
| 10,544,505 B2 | 1/2020 | Yang et al. | |
| 10,745,282 B2 | 8/2020 | Venkatasubramanian et al. | |
| 10,954,129 B2 | 3/2021 | Koshizawa et al. | |
| 11,043,372 B2 | 6/2021 | Venkatasubramanian et al. | |
| 11,043,375 B2 | 6/2021 | Yang et al. | |
| 2001/0032591 A1 | 10/2001 | Carducci et al. | |
| 2002/0069970 A1* | 6/2002 | Noorbakhsh | H01J 37/32633 118/724 |
| 2004/0045934 A1 | 3/2004 | Harvey et al. | |
| 2004/0238125 A1* | 12/2004 | Ono | H01J 37/32688 156/345.46 |
| 2004/0261720 A1 | 12/2004 | Tolmachev et al. | |
| 2005/0279624 A1 | 12/2005 | Brcka | |
| 2007/0158026 A1* | 7/2007 | Amikura | C23C 16/45572 156/345.34 |
| 2008/0062609 A1* | 3/2008 | Himori | H01L 21/6833 361/234 |
| 2008/0277063 A1 | 11/2008 | Shin | |
| 2009/0029067 A1 | 1/2009 | Sciamanna et al. | |
| 2009/0133835 A1* | 5/2009 | Nishimoto | C23C 16/511 156/345.27 |
| 2009/0212010 A1 | 8/2009 | Wang et al. | |
| 2011/0244142 A1 | 10/2011 | Cheng et al. | |
| 2013/0008603 A1 | 1/2013 | Eto et al. | |
| 2014/0170853 A1 | 6/2014 | Shamma et al. | |
| 2014/0335700 A1 | 11/2014 | Denifl et al. | |
| 2014/0370711 A1 | 12/2014 | Cheng et al. | |
| 2015/0311044 A1* | 10/2015 | Sun | C23C 14/081 428/139 |
| 2015/0371851 A1 | 12/2015 | Lee et al. | |
| 2016/0086794 A9 | 3/2016 | Cheng et al. | |
| 2016/0225632 A1 | 8/2016 | Shaikh et al. | |
| 2017/0040140 A1 | 2/2017 | Tanaka et al. | |
| 2017/0069464 A1 | 3/2017 | Ye et al. | |
| 2017/0103893 A1 | 4/2017 | Kulshreshtha et al. | |
| 2018/0274089 A1 | 9/2018 | Yang et al. | |
| 2018/0274100 A1 | 9/2018 | Yang et al. | |
| 2018/0277340 A1 | 9/2018 | Yang et al. | |
| 2018/0354804 A1 | 12/2018 | Venkatasubramanian et al. | |
| 2018/0358222 A1 | 12/2018 | Venkatasubramanian et al. | |
| 2018/0358229 A1 | 12/2018 | Koshizawa et al. | |
| 2019/0057862 A1 | 2/2019 | Yang et al. | |
| 2020/0331762 A1 | 10/2020 | Venkatasubramanian et al. | |

FOREIGN PATENT DOCUMENTS

| | | |
|---|---|---|
| TW | 468209 B | 12/2001 |
| WO | 2006103333 A2 | 10/2006 |

OTHER PUBLICATIONS

International Search Report and Written Opinion dated Sep. 30, 2021 for Application No. PCT/US2021/036114.

International Search Report and Written Opinion dated Sep. 30, 2021 for Application No. PCT/US2021/036188.

International Search Report and Written Opinion dated Sep. 29, 2021 for Application No. PCT/US2021/036195.

* cited by examiner

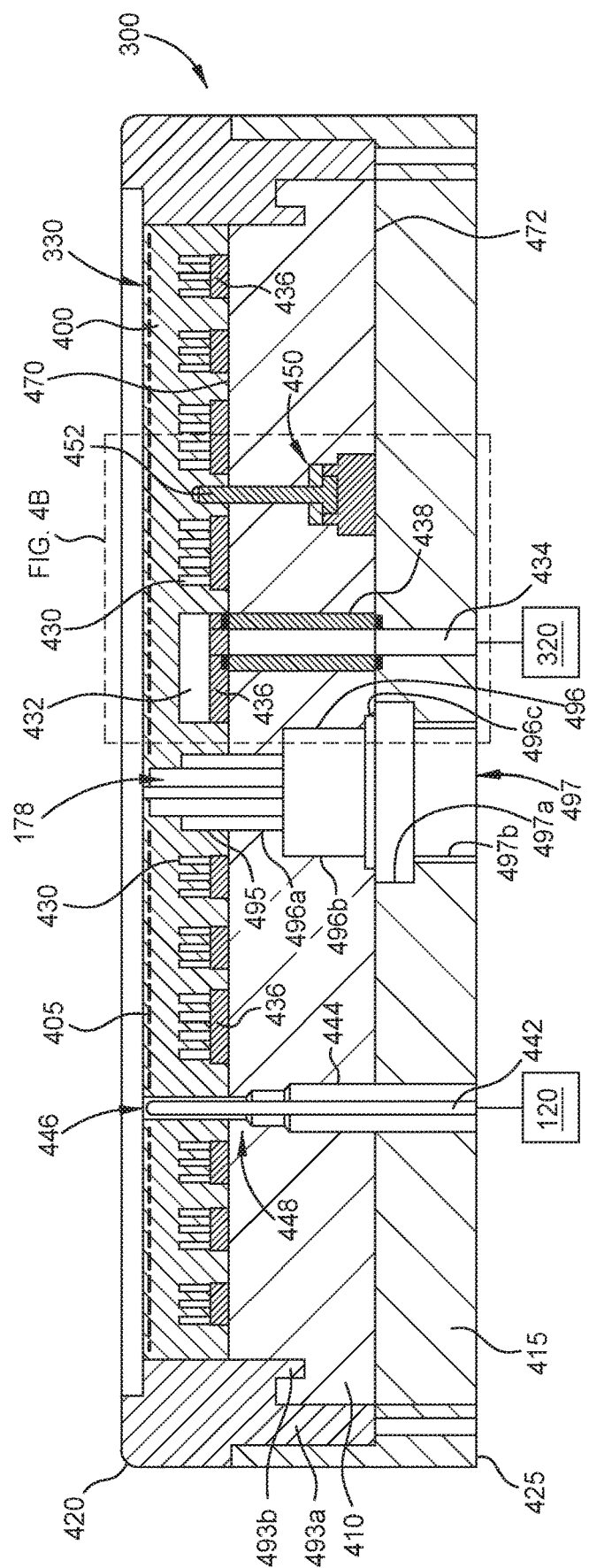

SUBSTRATE PROCESSING CHAMBER

CROSS-REFERENCE TO RELATED APPLICATIONS

This application claims priority to U.S. Provisional Patent Application Ser. No. 62/582,723, filed May 24, 2019, and 62/888,666, filed Aug. 19, 2019, both applications are hereby incorporated by reference herein.

BACKGROUND

Field

Embodiments of the present disclosure generally relate to apparatus and methods utilized in the manufacture of semiconductor devices. More particularly, embodiments of the present disclosure relate to a substrate processing chamber, and components thereof, for forming semiconductor devices.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. As critical dimensions (CD) decrease, current hardmask materials lack the desired etch selectivity relative to underlying materials (e.g., oxides and nitrides) and are often difficult to deposit. Thus, what is needed in the art are improved methods and apparatus for fabricating semiconductor devices.

SUMMARY

Embodiments of the present disclosure generally relate to apparatus and methods utilized in the manufacture of semiconductor devices. More particularly, embodiments of the present disclosure relate to a substrate processing chamber, and components thereof, for forming semiconductor devices.

In one embodiment, a process chamber is disclosed that includes a lid assembly, a chamber body coupled to the lid assembly by a spacer. The spacer and the chamber body defining a resonance cavity. The process chamber also includes a rotatable magnet assembly coupled to the spacer outside of the resonance cavity, and a substrate support disposed and movable within the resonance cavity, wherein the substrate support is coupled to a facilities cable that flexes based on operation of an actuator coupled to the substrate support.

In another embodiment, a process chamber is disclosed that includes a lid assembly comprising a showerhead, a chamber body coupled to the lid assembly by a spacer. The spacer and the chamber body defining a resonance cavity. The process chamber also includes a magnet assembly coupled to the spacer outside of the resonance cavity, and a substrate support disposed within the resonance cavity, wherein the substrate support is coupled to a facilities cable and comprises an electrostatic chuck having a puck including a plurality of electrodes.

In another embodiment, a process chamber is disclosed that includes a lid assembly comprising a showerhead, a chamber body coupled to the lid assembly by a spacer. The spacer and the chamber body defining a resonance cavity. The process chamber also includes a magnet assembly coupled to the spacer outside of the resonance cavity, and a substrate support movably disposed within the resonance cavity, wherein the substrate support is coupled to a facilities cable that includes a single piece conductor including a bend, and wherein the substrate support comprises an electrostatic chuck having a puck including a plurality of electrodes.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure can admit to other equally effective embodiments.

FIG. 4A is a schematic sectional view the substrate support according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to a substrate processing chamber utilized in substrate processing in the manufacture of electronic devices. Substrate processing includes deposition processes, etch processes, as well as other low pressure, processes, plasma processes, thermal processes used to manufacture electronic devices on substrates. Examples of processing chambers and/or systems that may be adapted to benefit from exemplary aspects of the disclosure is the Producer® APF™ PECVD system commercially available from Applied Materials, Inc., located in Santa Clara, Calif. It is contemplated that other processing chambers and/or processing platforms, including those from other manufacturers, may be adapted to benefit from aspects of the disclosure.

Embodiments of the deposition chamber disclosed herein may be utilized for the fabrication of memory devices, and in particular, for the deposition of hardmasks utilized during fabrication of memory devices. Current memory devices are able to retain stored data for a very long period of time without applying a voltage thereto, and the reading rate of such memory devices is relatively high. It is relatively easy to erase stored data and rewrite data into the memory devices. Thus, memory devices have been widely used in micro-computers, and automatic control systems, etc. To increase the bit density and reduce the cost per bit of memory devices, 3D NAND (three-dimensional not AND) memory devices have been developed. Other memory devices, such as DRAM (dynamic random access memory), EM (expanded memory) and ReRAM (resistive random access memory), as well as advanced hardmask materials for forming the same, are also being developed to further facilitate advances in the semiconductor industry.

Vertical gate 3D memory cells are being explored for 3D NAND technologies to reduce cost as the number of memory cell layers increase. Oxide/silicon and oxide/nitride layer stacks are useful due to material integration advantages, but with an increasing number of memory cell layers, thickness of the layers becomes a limiting factor. Thus, while there is an interest in reducing the thickness of the memory cell layers, issues of oxide quality (i.e. breakdown voltage), silicon resistivity, and high aspect ratio etching persist with the reduced layer thickness.

Figure 1:
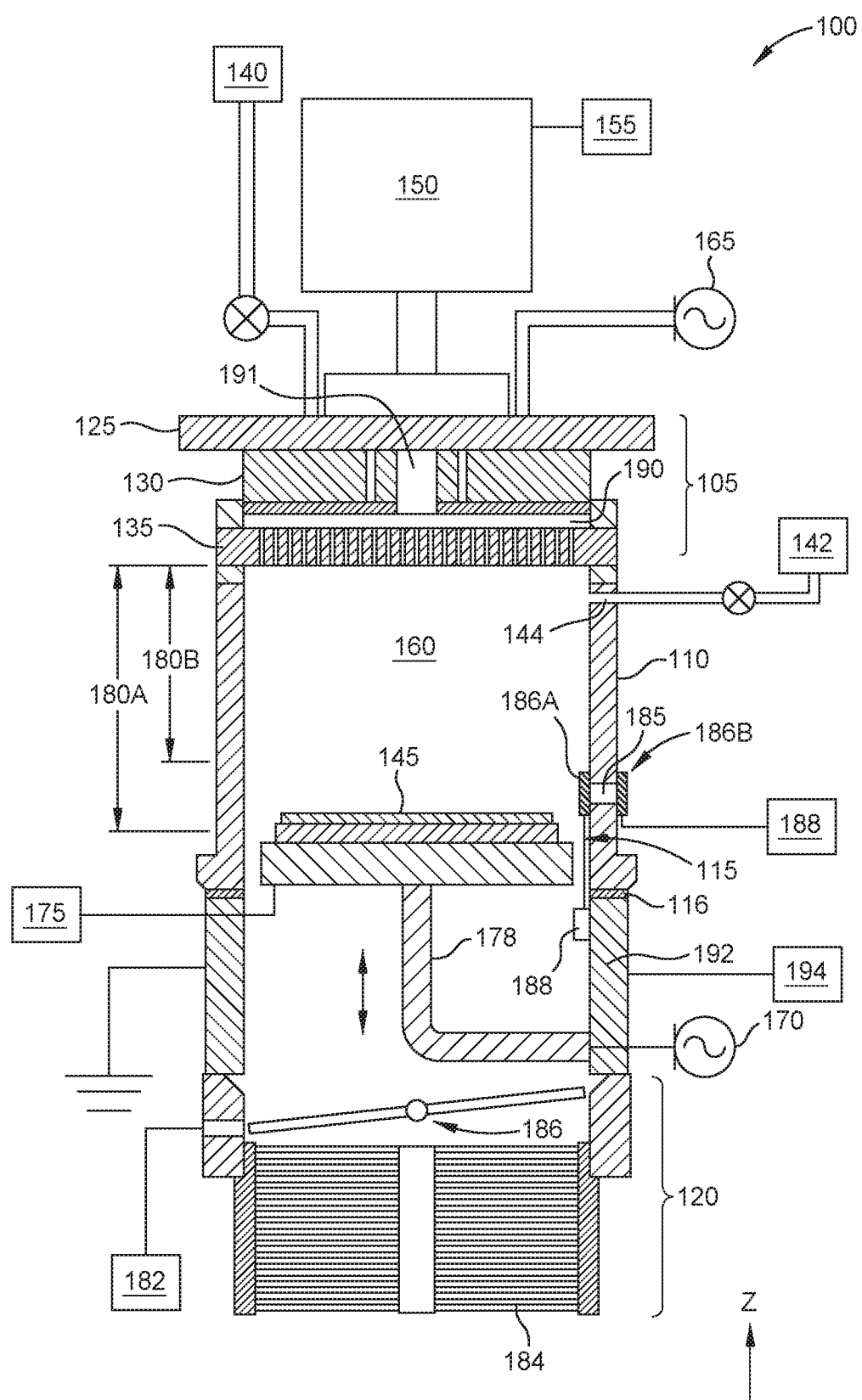
FIG. 1 is a schematic side cross sectional view of an illustrative processing chamber according to an embodiment.

FIG. 1 is a schematic side cross sectional view of an illustrative processing chamber 100 suitable for conducting a deposition process. In one embodiment, which can be combined with other embodiments described herein, the processing chamber 100 may be configured to deposit advanced patterning films onto a substrate, such as hardmask films, for example amorphous carbon hardmask films.

The processing chamber 100 includes a lid assembly 105, a spacer 110 disposed on a chamber body 192, a substrate support 115, and a variable pressure system 120. The lid assembly 105 includes a lid plate 125 and a heat exchanger 130. In the embodiment shown, which can be combined with other embodiments described herein, the lid assembly 105 also includes a showerhead 135. However, in other embodiments, which can be combined with other embodiments described herein, the lid assembly 105 includes a concave or dome-shaped gas introduction plate (shown in FIG. 7).

The lid assembly 105 is coupled to a first processing gas source 140. The first processing gas source 140 contains precursor gases for forming films on a substrate 145 supported on the substrate support 115. As an example, the first processing gas source 140 includes precursor gases such as carbon containing gases, hydrogen containing gases, helium, among others. In a specific example, the carbon containing gas includes acetylene ($C_2H_2$). The first processing gas source 140 provides precursors gases to a plenum 190 disposed in the lid assembly 105. The lid assembly includes one or more channels for directing precursor gases from the first processing gas source 140 into the plenum 190. From the plenum, the precursor gases flow through the showerhead 135 into a processing volume 160. In some embodiments, which can be combined with other embodiments described herein, a second processing gas source 142 is fluidly coupled to the processing volume 160 via an inlet 144 disposed through the spacer 110. As an example, the second processing gas source 142 includes precursor gases such as carbon containing gases, hydrogen containing gases, helium, among others, for example $C_2H_2$. In one some embodiment, which can be combined with other embodiments described herein, a total flow rate of precursor gases into the processing volume 160 is about 100 sccm to about 2 slm. The flow of precursor gases in the processing volume 160 via the second processing gas source 142 modulates the flow of precursor gases flow through the showerhead 135 such that the precursor gases are uniformly distributed in the processing volume 160. In one example, a plurality of inlets 144 may be radially distributed about the spacer 110. In such an example, gas flow to each of the inlets 144 may be separately controlled to further facilitate gas uniformity within the processing volume 160.

The lid assembly 105 is also coupled to an optional remote plasma source 150. The remote plasma source 150 is coupled to a cleaning gas source 155 for providing cleaning gases to the processing volume 160 formed inside the spacer 110 between the lid assembly 105 and the substrate 145. In one example, cleaning gases are provided through a central conduit 191 formed axially through the lid assembly 105. In another example, cleaning gases are provided through the same channels which direct precursor gases. Example cleaning gases include oxygen-containing gases such as oxygen and/or ozone, as well fluorine containing gases such as $NF_3$, or combinations thereof.

In addition to or as an alternative to the remote plasma source 150, the lid assembly 105 is also coupled to a first or upper radio frequency (RF) power source 165. The first RF power source 165 facilitates maintenance or generation of plasma, such as a plasma generated from a cleaning gas. In one example, the remote plasma source 150 is omitted, and the cleaning gas is ionized into a plasma in situ via the first RF power source 165. The substrate support 115 is coupled to a second or lower RF power source 170. The first RF power source 165 may be a high frequency RF power source (for example, about 13.56 MHz to about 120 MHz) and the second RF power source 170 may be a low frequency RF power source (for example, about 2 MHz to about 13.56 MHz). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, improves film deposition. In one example, utilizing a second RF power source 170 provides dual frequency powers. A first frequency of about 2 MHz to about 13.56 MHz improves implantation of species into the deposited film, while a second frequency of about 13.56 MHz to about 120 MHz increases ionization and deposition rate of the film.

One or both of the first RF power source 165 and the second RF power source 170 are utilized in creating or maintaining a plasma in the processing volume 160. For example, the second RF power source 170 may be utilized during a deposition process and the first RF power source 165 may be utilized during a cleaning process (alone or in conjunction with the remote plasma source 150). In some deposition processes, the first RF power source 165 is used in conjunction with the second RF power source 170. During a deposition or etch process, one or both of the first RF power source 165 and the second RF power source 170 provide a power of about 100 Watts (W) to about 20,000 W in the processing volume 160 to facilitation ionization of a precursor gas. In one embodiment, which can be combined with other embodiments described herein, at least one of the first RF power source 165 and the second RF power source 170 are pulsed. In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and He is provided at a flow rate of about 50 sccm to about 10,000 sccm.

The substrate support 115 is coupled to an actuator 175 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. The height of the spacer 110 is about 0.5 inches to about 20 inches. In one example, the substrate support 115 is movable from a first distance 180A to a second distance 180B relative to the lid assembly 105 (for example, relative to a lower surface of the showerhead 135). In one embodiment, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the showerhead 135. In another example, the substrate support 115 is fixed at one of the first distance 180A and the second distance 180B. In contrast to conventional plasma enhanced chemical vapor deposition (PECVD) processes, the spacer 110 greatly increases the distance between (and thus the volume between) the substrate support 115 and the lid assembly 105. The increased distance between the substrate support 115 and the lid assembly 105 reduces collisions of ionized species in the volume process volume 160, resulting in deposition of film with less neutral stress, such as less than 2.5 gigapascal (GPa). Films deposited with less neutral stress facilitate improved planarity (e.g., less bowing) of substrates upon which the film is formed. Reduced bowing of substrates results in improved precision of downstream patterning operations.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still sub-atmospheric) pressure. In one example, the first pump 182 maintains a pressure within the processing chamber less than 50 mtorr during a cleaning process. In another example, the first pump 182 maintains a pressure within the processing chamber of about 0.5 mTorr to about 10 Torr. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be one a turbo pump and a cryogenic pump. The second pump 184 is utilized during a deposition process. The second pump 184 is generally configured to operate a relatively lower volumetric flow rate and/or pressure. For example, the second pump 184 is configured to maintain the processing region 160 of the process chamber at a pressure of less than about 50 mtorr. In another example, the second pump 184 maintains a pressure within the processing chamber of about 0.5 mtorr to about 10 Torr. The reduced pressure of the processing region 160 maintained during deposition facilitates deposition of a film having reduced neutral stress and/or increased $sp^2$-$sp^3$ conversion, when depositing carbon-based hardmasks. Thus, process chamber 100 is configured to utilize both relatively lower pressure to improve deposition and relatively higher pressure to improve cleaning.

In some embodiments, which can be combined with other embodiments described herein, both of the first pump 182 and the second pump 184 are utilized during a deposition process to maintain the processing region 160 of the process chamber at a pressure of less than about 50 mtorr. In other embodiments, the first pump 182 and the second pump 184 maintain the processing region 160 at a pressure of about 0.5 mTorr to about 10 Torr. A valve 186 is utilized to control the conductance path to one or both of the first pump 182 and the second pump 184. The valve 186 also provides symmetrical pumping from the processing volume 160.

The processing chamber 100 also includes a substrate transfer port 185. The substrate transfer port 185 is selectively sealed by an interior door 186A and an exterior door 186B. Each of the doors 186A and 186B are coupled to actuators 188 (i.e., a door actuator). The doors 186A and 186B facilitate vacuum sealing of the processing volume 160. The doors 186A and 186B also provide symmetrical RF application and/or plasma symmetry within the processing volume 160. In one example, at least the door 186A is formed of a material that facilitates conductance of RF power, such as stainless steel, aluminum, or alloys thereof. Seals 116, such as O-rings, disposed at the interface of the spacer 110 and the chamber body 192 may further seal the processing volume 160. A controller 194 coupled to the processing chamber 100 is configured to control aspects of the processing chamber 100 during processing.

Figure 2A:
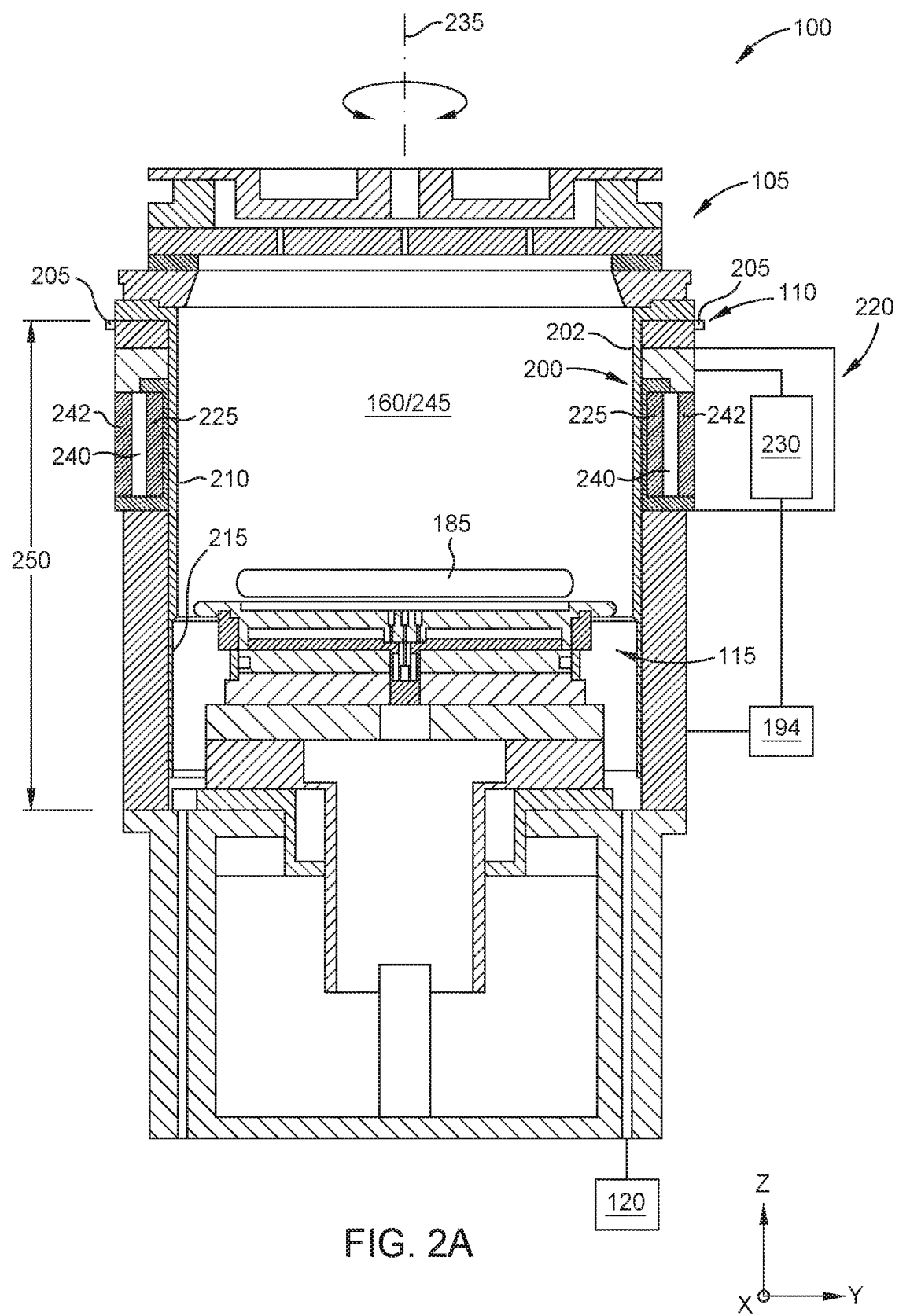
FIG. 2A is a schematic side view of the processing chamber of FIG. 1 rotated about 90 degrees according to an embodiment.
Figure 2B:
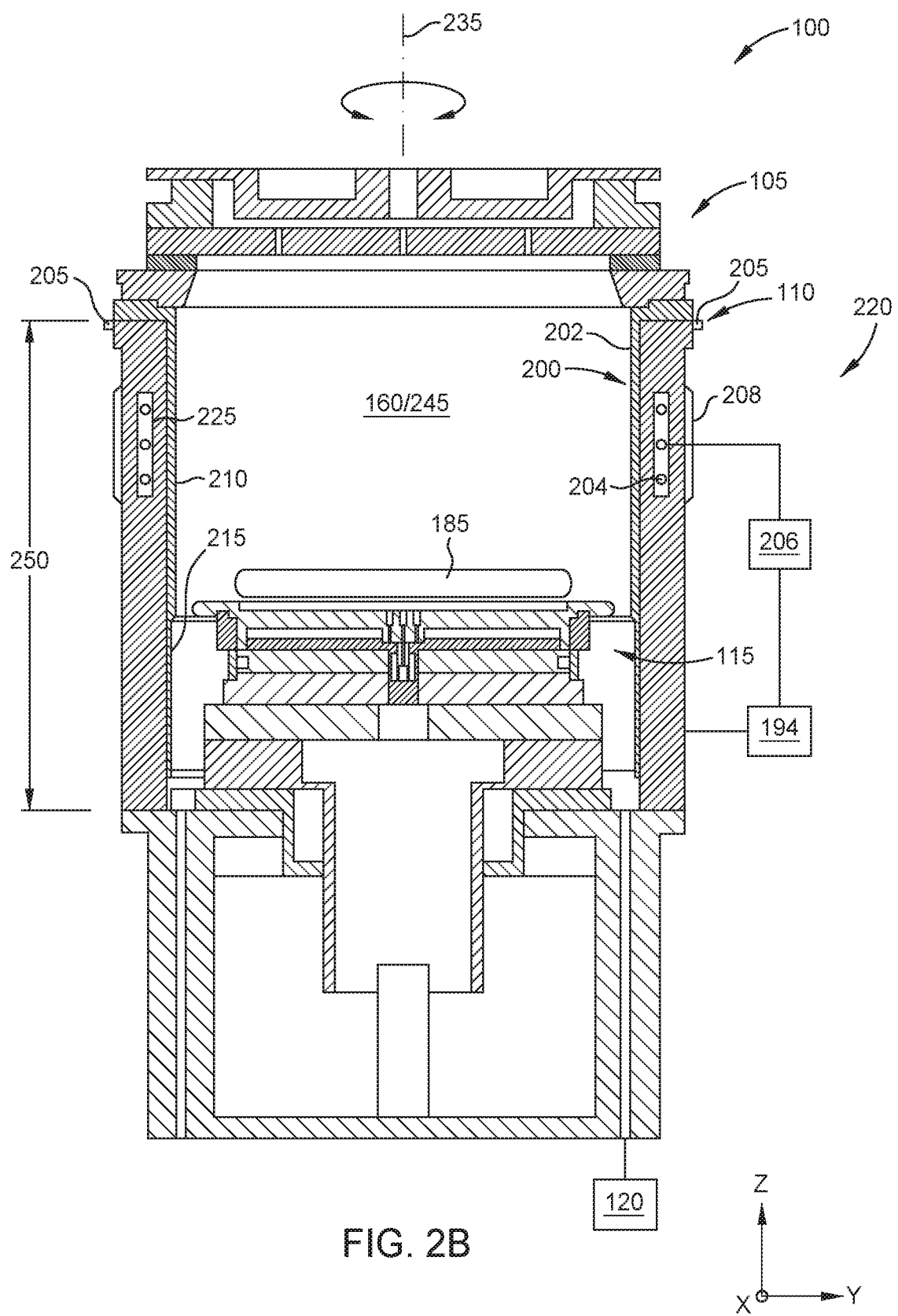
FIG. 2B is a schematic side view of the processing chamber of FIG. 1 rotated about 90 degrees according to an embodiment.

FIGS. 2A and 2B are schematic side views of the processing chamber 100 of FIG. 1 rotated about 90 degrees. In FIGS. 2A and 2B, details of the spacer 110 are shown. The spacer 110 includes a liner 200 that surrounds the processing volume 160. In one embodiment, which can be combined with other embodiments described herein, the spacer 110 and the liner 200 consist of a single member. The liner 200 may be bonded (e.g., diffusion bonded) to the spacer 110.

The spacer 110 also includes a plurality of heater elements 205 embedded in or in thermal communication with the body of the spacer 110. The heater elements 205 are utilized to maintain the temperature of the spacer 110 at about 80 degrees Celsius, or greater. Each of the heater elements 205 may be cartridge heaters.

The liner 200 includes an upper or first portion 210 and a lower or second portion 215. The thicknesses of the liner 200, for example, the thickness of the portion 210 and the thickness of the second portion 215, may be varied. The varied thickness of the liner 200 provides the ability to control the flow conductance in a lower portion of the processing volume 160. Controlling the flow conductance in the lower portion of the processing volume 160 provides the ability to expose the substrate 185 to a substantially uniform distribution precursors gases and the ability to uniformly expose the processing volume 160 cleaning gases, resulting in more uniform processing of substrates. In one embodiment, which can be combined with other embodiments described herein, the first portion 210 has a thickness that is greater than a thickness of the second portion 215. One benefit of the reduced thickness of the second portion 215 is increased space between the substrate support 115 and the interior wall of the spacer 110 thus increasing vacuum conductance. Another benefit of the reduced thickness of the second portion 215 is a change in thermal mass of the liner 200. Thus, parts of the liner 200 adjacent to or in the first portion 210 are maintained at a temperature that is greater than a temperature of parts of the liner 200 adjacent to or in the second portion 215.

The liner 200 is includes an interior surface 202 to be exposed to the processing volume 160. In one embodiment, which can be combined with other embodiments described herein, the interior surface 202 may include one or more materials including aluminum, titanium, or alloys thereof. The interior surface 202 of the liner 200 may be coated with one or more of the aluminum, titanium, or alloys thereof. In another embodiment, which can be combined with other embodiments described herein, the interior surface 202 may include one or more ceramic containing materials. In one example, the liner 200 extends from the lid assembly 105, past the substrate support 115, and adjacent a bottom of the processing chamber 100. In such an example, the liner 200 may not contact the bottom of the chamber 100, but is instead spaced apart therefrom. In addition, while FIGS. 2A and 2B illustrate a liner 200 as being a single member, it is contemplated that multiple liners may be utilized to line interior surfaces of the process chamber. For example, a first (or upper) liner may be utilized to line the spacer 110, while a second (or lower) liner may be used to line interior surfaces of the chamber body (shown in FIG. 1).

In the embodiments described herein, the conductivity of the liner 200, controlled by at least one of the interior surface 202 to be exposed to the processing volume 160 and the thickness of the liner 200, changes the current flow (e.g., direct current (DC), RF current, and other suitable currents) provided to the electrostatic chuck 330 (shown in FIG. 3) of the substrate support 115. Increasing the conductivity of the liner 200, provides a short and symmetrical path for RF energy of a plasma sheath generated in the processing volume 160 to propagate from the sidewalls to a ground. The path for RF energy to propagate from the sidewalls to the ground improves current flow and reduces the amount of current required by the electrostatic chuck 330 through increased efficiency. The reduction of the amount of current required by the electrostatic chuck 330 allows for the delivery of increased voltage (e.g., $V_{dc}$) to the electrostatic chuck 330 through increased efficiency. The increased voltage results in greater ionization of the plasma sheath for increased ion or radical bombardment of the substrate 105. Increased ion or radical bombardment of the substrate 105 reduces the stress of the film to be deposited or etched.

The spacer 110 also includes a magnet assembly 220. In one embodiment, which can be combined with other embodiments described herein, as shown in FIG. 2A, the magnet assembly 220 includes a plurality of magnets 225 that surround the spacer 110. Each of the magnets 225 are coupled to an actuator 230 (i.e., a magnet actuator). The actuator 230 rotates the magnets 225 around the spacer 110 outside of the liner 200 about a longitudinal axis 235 of the processing chamber 100. The actuator 230 is also adapted to move the magnets 225 vertically (in the Z direction) along the longitudinal axis 235. Each of the magnets 225 may be permanent magnets, or electromagnets, or a combination thereof. Each of the magnets 225 are positioned within a cavity 240 formed in a sidewall 242 of the spacer 110. In one example, the magnets are positioned below the heater elements 205. The materials and the thickness of the outer sidewall 242 provide for confinement of the magnetic fields to the processing volume 160 by controlling the magnetic permeability of the outer sidewall 242. Confinement of the magnetic fields to the processing volume 160 mitigates influence of the magnetic fields on nearby processing volumes of adjacent process chambers, thus improving process uniformity. The controller 194 coupled to the processing chamber 100 and the magnet assembly 220 is configured to control aspects of the processing chamber 100 and magnet assembly 220 during processing.

In another embodiment, which can be combined with other embodiments described herein, as shown in FIG. 2B, magnet assembly 220 includes an electrically conductive wire 204 that may be coiled around (or embedded within) the spacer 110 one or more times to form a single electromagnet which circumscribes the spacer 110. A power source 206 is coupled to the conductive wire 204 to flow current in a circular path about the processing volume 160. The electrically conductive wire 204 may be disposed in one of the spacer 100 and the liner 200. The materials and the thickness of an outer shield 208 provide for confinement of the magnetic fields to the processing volume 160 by controlling the magnetic permeability of the outer shield 208. Confinement of the magnetic fields to the processing volume 160 mitigates influence of the magnetic fields on nearby process volumes of adjacent process chambers, thus improving process uniformity.

In some embodiments, which can be combined with other embodiments described herein, about one half of the plurality of magnets 225 is oriented with the North pole facing the substrate support 115 (substantially parallel to the longitudinal axis 235). The other portion of the plurality of magnets 225 is oriented with the South pole facing the substrate support 115 (substantially parallel to the longitudinal axis 235). In one example, the plurality of magnets 225 is arranged in a circle about the spacer 110 (in plan view). The plurality of magnets 225 are separated into a first portion or first semi-circle and a second portion or second semi-circle. Each of the magnets 225 in the first semi-circle is oriented with the North pole facing the substrate support 115 (substantially parallel to the longitudinal axis 235). Each of the magnets 225 in the second semi-circle are oriented with the South pole facing the substrate support 115 (substantially parallel to the longitudinal axis 235). In such an example, the plurality of magnets 225 may be rotated during deposition, or the plurality of magnets may remain stationary.

In some embodiments, which can be combined with other embodiments described herein, the conductive wire 204 includes at least one of air gaps in the core material of the conductive wire 204, a varying cross sectional area of the core material, and a varying distance between each turn of the conductive wire 204. The core material of a first half (e.g., encompassing about 180 degrees) of the conductive wire 204 may have more air gaps than a second half (e.g., encompassing about 180 degrees) of the conductive wire 204. The core material of the first half of the conductive wire 204 may have a greater cross sectional area than the cross sectional area of the second half of the conductive wire 204. The distance between each turn of the conductive wire 204 of the first half may be less that than the distance between each turn of the conductive wire 204 of the second half.

In other embodiments, which can be combined with other embodiments described herein, the magnet assembly 220 includes two or more electrically conductive wires 204. Each of the conductive wires 204 is disposed in a respective portion of the portion of the spacer 110. Power sources 206 operable to be electrically are connectable to the controller 194. The controller 194 is operable to sequentially turn on or off each of the power sources 206 and concurrently turn on or off each of the power sources 206 to control the supply of power to each of the conductive wires 204. Concurrently turning off each of the power sources 206 enables shunting of magnetic fields produced by the electromagnets. In one example, a first conductive wire is coiled one or more times in a semi-circle and is disposed in a first half of the spacer 110 corresponding to a first half of the processing volume 160 to form a first electromagnet. A second conductive wire is coiled one or more times in a semi-circle and is disposed in a second half of the spacer 110 corresponding to a second half of the processing volume 160 to form a second electromagnet. The first and second electromagnets may have opposing polarities.

In another example, a first conductive wire is coiled one or more times in a semi-circle having an angular arc of 90 degrees or less and is disposed in a first quadrant of the spacer 110 corresponding to a first quadrant of the processing volume 160 to form a first electromagnet. A second conductive wire is coiled one or more times in a semi-circle having an angular arc of 90 degrees or less and is disposed in a second quadrant of the spacer 110 corresponding to a second quadrant of the processing volume 160 to form a second electromagnet. A third conductive wire is coiled one or more times in a semi-circle having an angular arc of 90 degrees or less and is disposed in a third quadrant of the spacer 110 corresponding to a third quadrant of the processing volume 160 to form a third electromagnet. A fourth conductive wire is coiled one or more times in a semi-circle having an angular arc of 90 degrees or less and is disposed in a fourth quadrant of the spacer 110 corresponding to a fourth quadrant of the processing volume 160 to form a fourth electromagnet. The first, second, third, and fourth electromagnets may have alternating polarities.

The magnet assembly 220 aids in plasma confinement and/or tuning in the processing volume 160. In one embodiment, which can be combined with other embodiments described herein, the magnet assembly 220 also forms a resonance cavity 245 within the processing volume 160 during a deposition process. The resonance cavity 245 provides a magnetic flux that extends the plasma sheath vertically downward (Z direction) towards a substrate (not shown in FIGS. 2A and 2B). The strength of one of the magnets 225 and the core material of the conductive wire 204 provides for compression the plasma in the processing volume 160 and extends the sheath of the plasma radially outward to the spacer 110. As previously described, extending the sheath of the plasma to the spacer 110 (e.g., to the liner 200 of the spacer 110) provides the short and symmetrical path for RF energy to propagate from the sidewalls to a ground.

The magnet assembly 220 provides a B-field in an X/Y plane as well as in the Z direction. The magnet assembly 220 also allows tuning of the plasma within the processing volume 160 and/or the resonance cavity 245. Eddy currents in the plasma may be monitored to provide a metric for adjusting one or both of the position of the magnets 225 and the rotation speed of the magnets 225. Additionally or alternatively, metrology of films previously deposited on a substrate may be performed, and the results utilized to vary positions and/or rotation speed of the magnets 225. Thus, the resonance cavity 245 and the magnet assembly 220 provide better film uniformity on a substrate. In embodiments including the magnets 225, the opposite polarities of the magnets 225 skews the B-field produced via the magnets 225. In some embodiments including the electromagnet, the adjustment of at least one of the air gaps, cross sectional area, and distance between each turn of the conductive wire 204 skews the B-field produced via the flow current through the conductive wire 204. In some embodiments including the two or more electromagnets having opposing or alternating polarities, sequentially providing power to each of the conductive wires 204 skews the B-field produced via the flow current through the conductive wires 204. The skewing of the B-field shifts the peak of the plasma sheath. The rotation of the magnets and flow current through the conductive wire 204 in a circular path about the processing volume 160 facilitates a more uniform exposure of the substrate 150 to ions and radicals of the skewed plasma sheath. In one embodiment, which can be combined with other embodiments described herein, a metal band (not shown) is disposed within the liner 200. The metal band may further shift the B-field.

The spacer 110 includes a height 250 that provides a volume of the processing volume 160 and/or the resonance cavity 245 that is much greater than conventional chambers. In some embodiments, previously described herein the height 250 is about 0.5 inches to about 20 inches, such as about 0.5 inches to about 3 inches, such as about 15 inches to about 20 inches. The height of the resonance cavity 245 provided by the height 250 provides many benefits. One benefit includes a reduction in film stress which decreases stress induced bow in the substrate being processed therein.

Figure 3A:
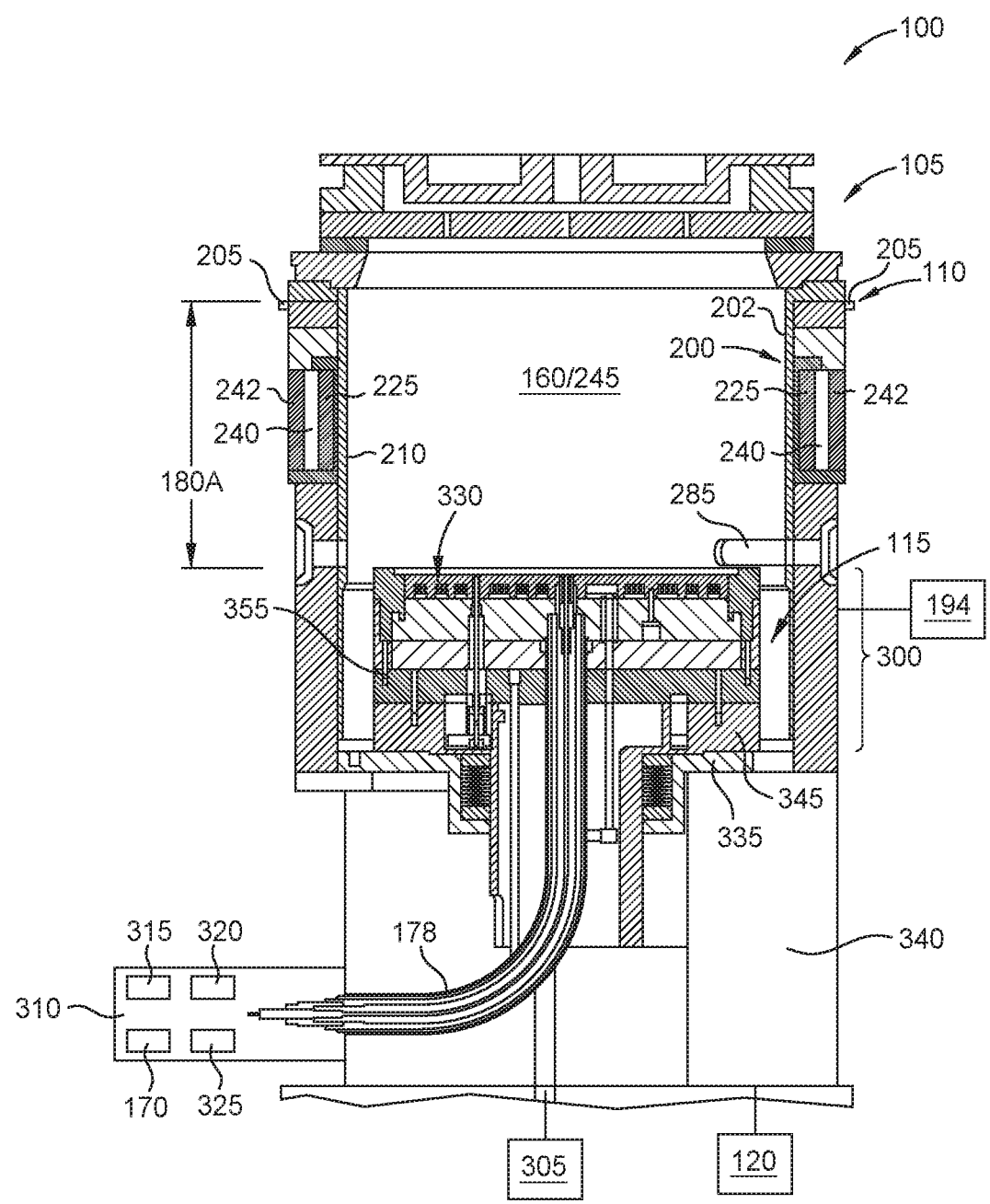
FIGS. 3A and 3B are schematic sectional views of the processing chamber according to an embodiment.
Figure 3B:
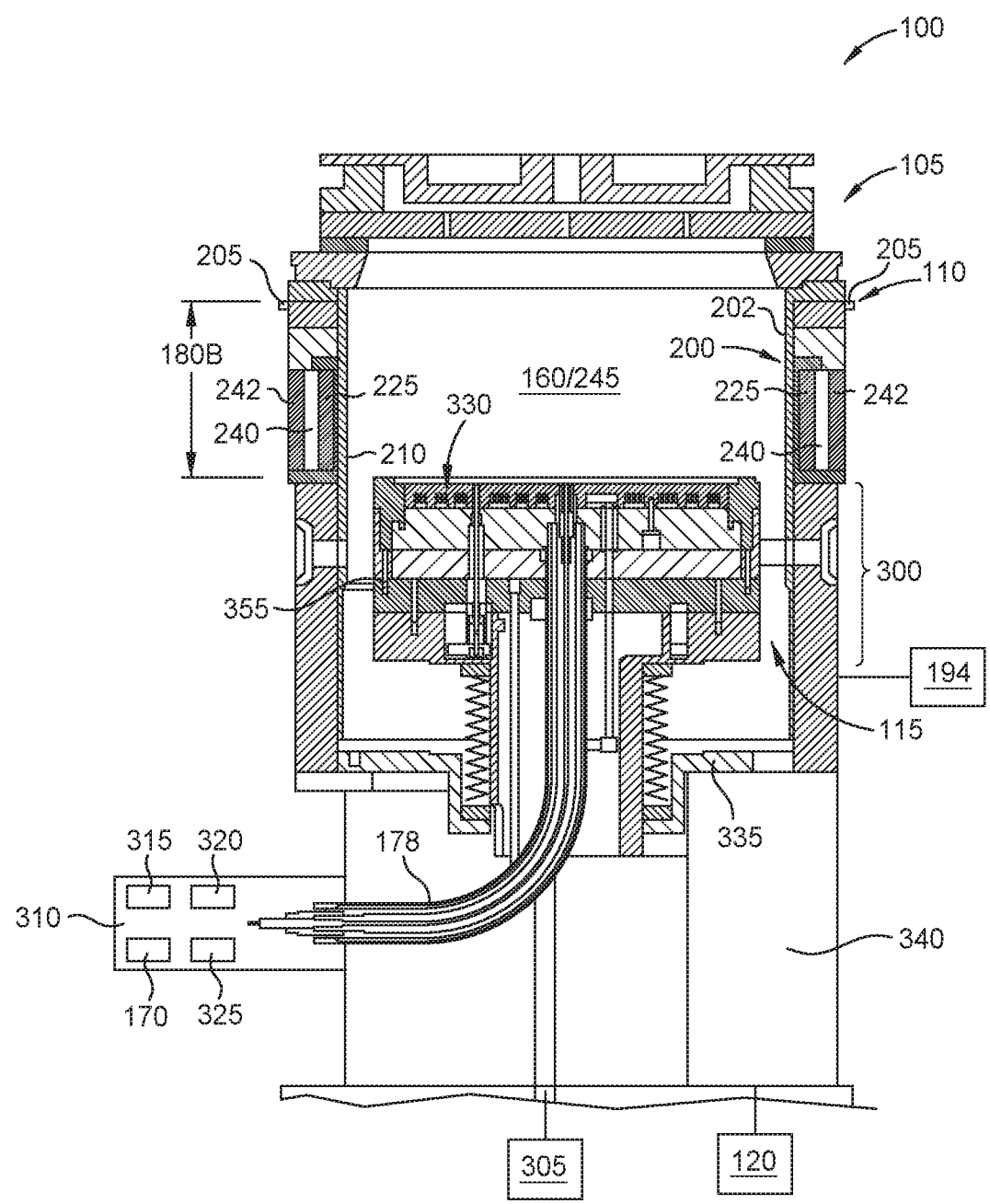

FIGS. 3A and 3B are schematic sectional views of the processing chamber 100. A cathode assembly 300, which includes the substrate support 115, is shown in FIGS. 3A and 3B. The cathode assembly 300 is coupled to an actuator 305 (similar to actuator 175 shown in FIG. 1) that moves the cathode assembly 300 vertically in the Z direction.

FIG. 3A shows the cathode assembly 300 in the lowermost position (e.g., the first distance 180A) relative to the lid assembly 105 and FIG. 3B shows the cathode assembly 300 in the uppermost position (e.g., the second distance 180B)

relative to the lid assembly 105. The ability to adjust the position of the cathode assembly 300 for deposition processes allows an optimum film quality to be achieved.

The cathode assembly 300 also includes a facilities interface 310. The facilities interface 310 provides connections for RF power as well as other electrical and fluid connections. The facilities interface 310 is coupled to the substrate support 115 via the facilities cable 178. Other connections include a power source 315, a coolant source 320 and a gas supply 325.

The power source 315 is utilized to power an electrostatic chuck 330 that is part of the substrate support 115. The power source 315 may be a DC power source. De-chucking is facilitated by a controller (not shown) that drains the electrostatic chuck 330. In addition, the facilities cable 178 is coupled to the power source 170, optionally through a matching network, to facilitate operations within the processing chamber 100. In one example, the facilities cable 178 facilities transfer of RF power during PECVD process. Due to the relatively large volume created by the spacer 110, and the pressures at which processing chamber 100 operated during a PECVD process, higher power levels (compared to conventional PECVD processes) are used to establish and maintain a plasma. For example, the facilities cable may carry about 4 kW of power to about 9 kW of power, at 110 amps, during a PECVD process. It is contemplated that amperage may be reduced to range of about 78 amps to about 80 amps, without film quality degradation, when utilizing magnets 225 in a tuned configuration.

The coolant source 320 contains a coolant that chills the substrate support 115. For example, a coolant that from the coolant source 320 is flowed to the substrate support 115 to maintain a temperature of the electrostatic chuck 330 (and/or a substrate positioned thereon) at about 25 degrees Celsius or less. The electrostatic chuck 330 (and/or a substrate positioned thereon) may be maintained at a cryogenic temperature not greater than about −40 degrees Celsius. The cryogenic temperature enables of the ions to bombard the upward facing surfaces of the substrate 145 and/or materials disposed on the substrate 145 with decreased spontaneous deposition or etching to result in improved uniformity and properties of the deposited or etched film. The coolant includes a fluid, for example, a perfluoropolyether fluorinated fluid to maintain the cryogenic temperature.

The gas supply 325 provides a fluid to a space below the electrostatic chuck 330 in order to prevent condensation. The fluid may be clean dry air, nitrogen ($N_2$), helium (He), or other suitable gas. The fluid supplied to the space below the electrostatic chuck reduces condensation onto the electrostatic, including lower surfaces thereof.

One or some of the combination of the cooling of the substrate support 115, the heated spacer 110 (using the heater elements 205 shown in FIGS. 2A and 2B) and the resonance cavity 245 as described herein provides many benefits. The low temperature of the substrate increases deposition rate as well as decreases substrate bow. Maintaining the temperature of the spacer 110 and/or the liner 200 to below about 100 degrees Celsius facilitates more efficient cleaning and/or minimizes adhesion of particles onto the liner 200. To facilitate cooling of liner 200, one or more cooling channels may be formed in the spacer 110.

Also shown in FIGS. 3A and 3B is a support structure 335. While only one is shown, the support structure 335 has three vacuum channels 340 formed therein. The vacuum channels 340 are coupled to the variable pressure system 120. The vacuum channels 340 facilitate symmetrical pumping from the processing volume 160.

The cathode assembly 300 is coupled to a base ring 340 and an optional mounting plate 345. Fasteners 355 extend from the base ring 340 to secure the substrate support 115 thereon.

Figure 4B:
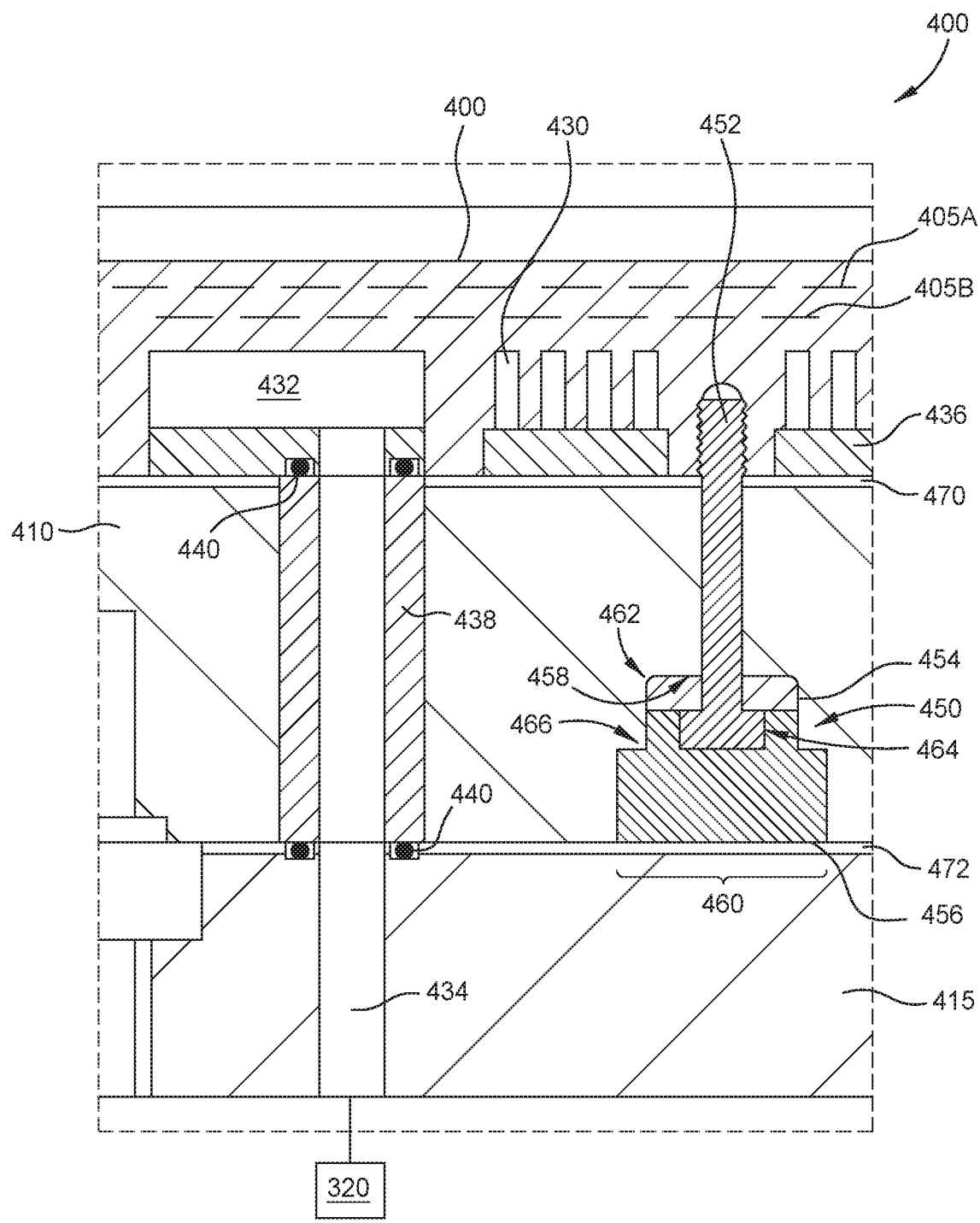
FIG. 4B is an enlarged sectional view of a portion of the substrate support shown in FIG. 4A according to an embodiment.

FIG. 4A is a schematic sectional view of one embodiment of the substrate support 115. FIG. 4B is an enlarged sectional view of a portion of the substrate support 115 shown in FIG. 4A.

As described above, the substrate support 115 includes an electrostatic chuck 330. The electrostatic chuck 330 includes a puck 400. The puck 400 includes one or more electrodes 405 embedded therein (a first electrode 405A and a second electrode 405B is shown in FIG. 4B). The first electrode 405A is utilized as a chucking electrode and the second electrode 405B is utilized as an RF biasing electrode. The substrate support 115 may be biased by providing RF power at a frequency of about 300 kHz to about 60 MHz to the second electrode 405B. The frequency provided to the second electrode 405B may be pulsed. The puck 400 is formed from a dielectric material, such as a ceramic material, for example aluminum nitride (AlN).

The puck is supported by a dielectric plate 410 and a base plate 415. The dielectric plate 410 may be formed from an electrically insulative material, such as quartz, or a thermoplastic material, such as high performance plastics sold under the tradename REXOLITE®. The base plate 415 may be made from a metallic material, such as aluminum. During operation, the base plate 415 is coupled to ground or is electrically floating while the puck 400 is RF hot. At least the puck 400 and the dielectric plate 410 are surrounded by an insulator ring 420. The insulator ring 420 may be made of a dielectric material such as quartz, silicon, or a ceramic material. The base plate 415 and a portion of the insulator ring 420 is surrounded by a ground ring 425 made of aluminum. The insulator ring 420 prevents or minimizes arcing between the puck 400 and the base plate 415 during operation. An end of the facilities cable 178 is shown in openings formed in the puck 400, the dielectric plate 410 and the base plate 415. Power for the electrodes of the puck 400, as well as fluids from the gas supply 325 (shown in FIGS. 3A and 3B) to the substrate support 115, is provided by the facilities cable 178.

An edge ring 422 is disposed adjacent to an inner circumference of the insulator ring 420. The edge ring 422 may comprise a dielectric material, such as quartz, silicon, cross-linked polystyrene and divinylbenzene (e.g., REXOLITE®), PEEK, $Al_2O_3$, AlN, among others. Utilizing an edge ring 422 comprising such a dielectric material helps modulate the plasma coupling, modulating the plasma properties, such as the voltage on the substrate support ($V_{dc}$), without having to change the plasma power, thus improving the properties of the hardmask films deposited on substrates. By modulating the RF coupling to the wafer or substrate through the material of the edge ring 422, the modulus of the film can be decoupled from the stress of the film.

Each of the puck 440, the dielectric plate 410, and the base plate 415 include a respectively axially aligned opening formed therein or therethrough for accommodating the facilities cable 178. The puck 440 includes an opening 495 shaped to engage the facilities cable 178. For example, the opening 495 may be configured as a female receptacle for receiving the facilities cable 178. The dielectric plate 410 includes an opening 496 axially aligned with the opening 495. The opening 496 includes an upper portion 496a having a diameter about equal to the diameter of the opening 495, a middle portion 496b having a diameter with a diameter greater than the diameter of the upper portion, and a lower portion 496c having a diameter greater than a diameter of the middle portion 496b. The base plate 415 includes an opening 497 having an upper portion 497a with a first diameter and a lower portion 497b with a second diameter less than the first diameter. The multiple diameters the openings 496, 496, and 497 facilitate securing of the facilities cable 178 therein.

The puck 400 includes a plurality of fluid channels 430 formed therein. Each of the fluid channels 430 are in fluid communication with an inlet channel 432. The inlet channel 432 is fluidly coupled to an inlet conduit 434. The inlet conduit 434 is coupled to the coolant source 320. Each of the fluid channels 430 and the inlet channel 432 are sealed by a cap plate 436. The cap plates 436 may be made of the same material as the puck 400, or aluminum, and can be welded or otherwise bonded to the puck 400 to seal the fluid channels 430 and the inlet conduit 434. While not shown, an outlet conduit, similar to the inlet conduit 434, is provided in the substrate support 115 such that the cooling fluid can be recirculated therein.

A portion of the inlet conduit 434 is formed by a tubular member 438. The tubular member 438 is formed from a dielectric material such as ceramic materials. Seals 440 are provided at ends of the tubular member 438 adjacent to the cap plates 436 and the base plate 415. The tubular member 438 prevents arcing that may be caused by the cooling fluid flowing therethrough. The tubular member 438 may also thermally insulate the dielectric plate 410 from the relatively cold cooling fluid flowing therein in order to prevent cracking of the dielectric plate 410.

The substrate support 115 also includes a plurality of lift pins 442 (only one is shown in FIG. 4A). Each of the lift pins 442 are movably disposed in a dielectric bushing 444. Each of the lift pins 442 may be formed from a ceramic material, such as AlN, sapphire, quartz, or the like. The dielectric bushing 444 is provided in or through each of the puck 400, the dielectric plate 410 and the base plate 415. The dielectric bushing 444 is made of a polymer material, such as a polytetrafluoroethylene (PTFE) material. The dielectric bushing 444 includes an opening 446 along the length direction thereof where the lift pin 442 is guided. The opening 446 is sized slightly larger than the dimension (diameter) of the lift pin 442 such that a conductance path is formed in the dielectric bushing 444. For example, the opening 446 is coupled to the variable pressure system 120 such that vacuum conductance is provided between the processing volume 160 and through the dielectric bushing 444 to the variable pressure system 120. The conductance path provided by the opening 446 prevents arcing of the lift pins. The dielectric bushing 444 includes a plurality of steps 448 which are varied diameter sections. The steps 448 reduce arcing between the puck 400 and the base plate 415 by increasing the length of the path electricity may travel, as well as by introducing angular turns along the path.

The substrate support 115 also includes a plurality of fastener devices 450 (only one is shown). The fastener devices 450 are utilized to attach the puck 400 to the dielectric plate 410. Each fastener device 450 includes a fastener 452, a metallic washer 454 and a fastener cap 456 (the washer 454 and fastener cap 456 are shown in FIG. 4B). When the fastener 452 is tightened, the washer 454 is urged against a surface 458 of an opening 460 formed in the dielectric plate 410. The washer 454 and the fastener 452 are made from a metallic material, such as stainless steel. The washer 454 includes a rounded upper corner 462. The rounded upper corner 462 prevents cracking of the material of the dielectric plate 410 when the fastener 452 is tightened.

The fastener cap 456 is utilized to fill the remainder of the opening 460 in the dielectric plate 410. The fastener cap 456 includes a pocket 464 that is sized to receive the head of the fastener 452. The fastener cap 456 is formed from a dielectric material, such as a polymer, for example, polyether ether ketone (PEEK). The outer surface of the fastener cap 456 includes a step 466. The step 466 reduces arcing between the puck 400 and the base plate 415 by increasing the length of the path electricity may travel.

The substrate support 115 also includes a plurality of gaps between layers thereof. A first gap 470 is provided between the puck 400 and the dielectric plate 410. A second gap 472 is provided between the dielectric plate 410 and the base plate 415. The first gap 470 and the second gap 472 are in fluid communication with the gas supply 325 shown and described in FIGS. 3A and 3B. Fluids from the gas supply 325 are flowed in the first gap 470 and the second gap 472 to prevent condensation between adjacent layers. Fluids in the first gap 470 and the second gap 472 are sealed on ends of the substrate support 115 by the edge ring 420. The edge ring 420 may be sized to provide a controlled leakage of fluids from the first gap 470 and the second gap 472.

Figure 5A:
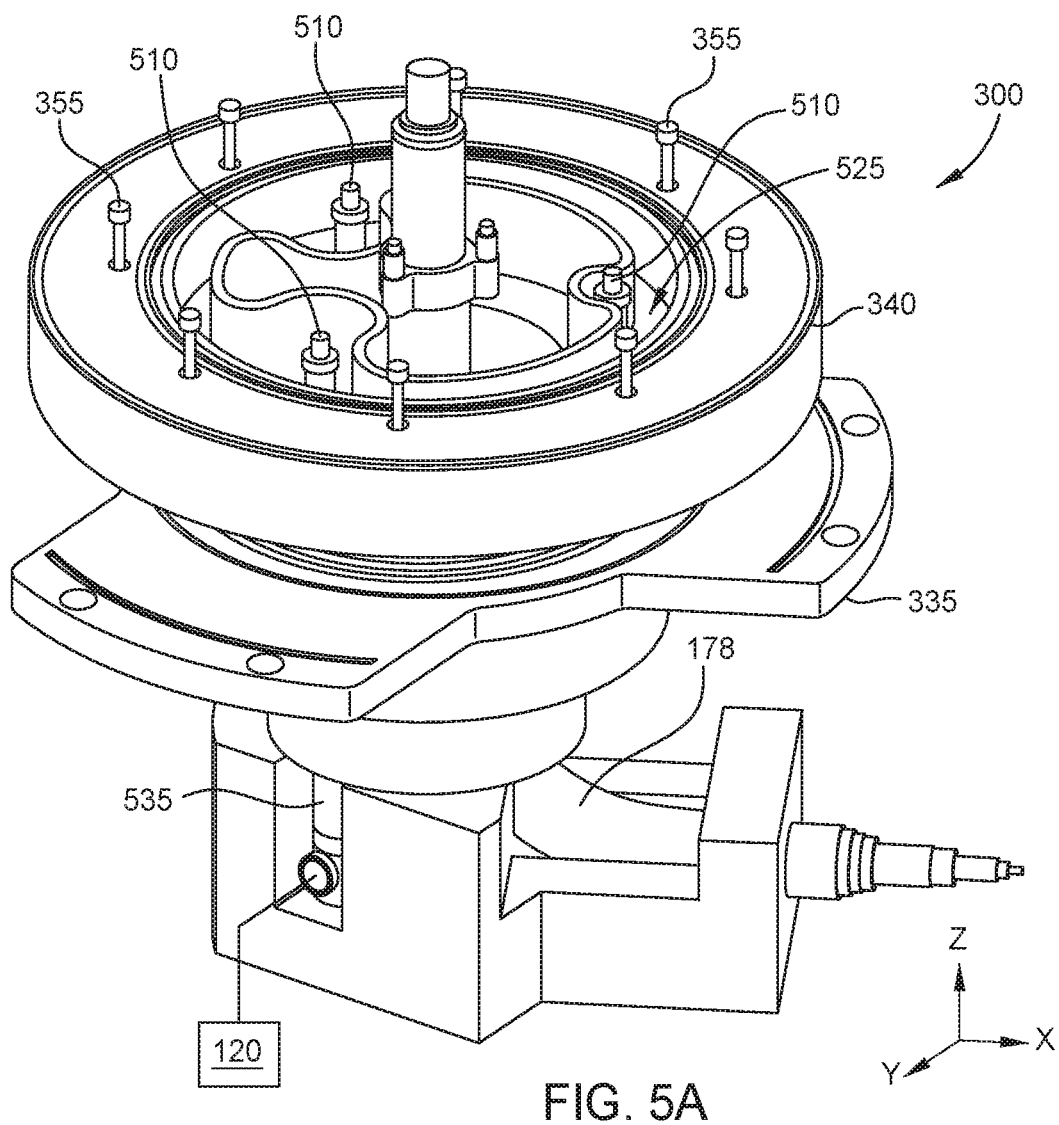
FIGS. 5A-5D are various views of a portion of the support structure and the cathode assembly of the substrate support according to an embodiment.
Figure 5B:
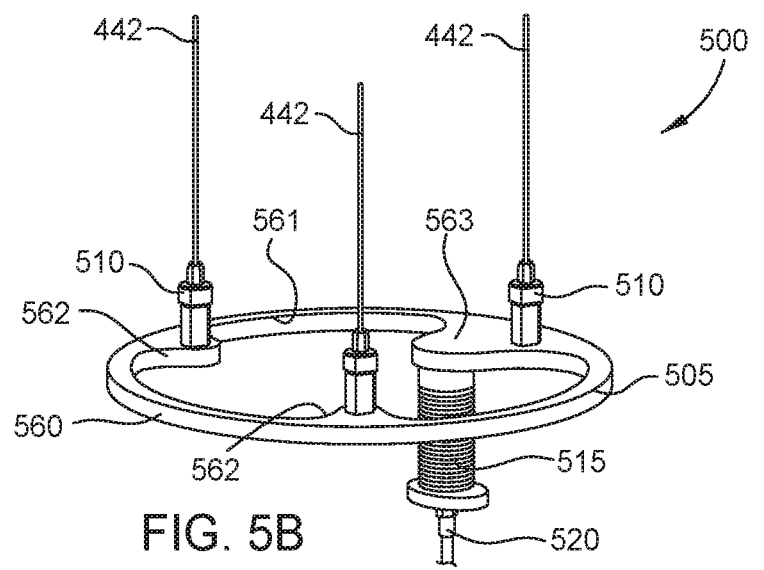
Figure 5C:
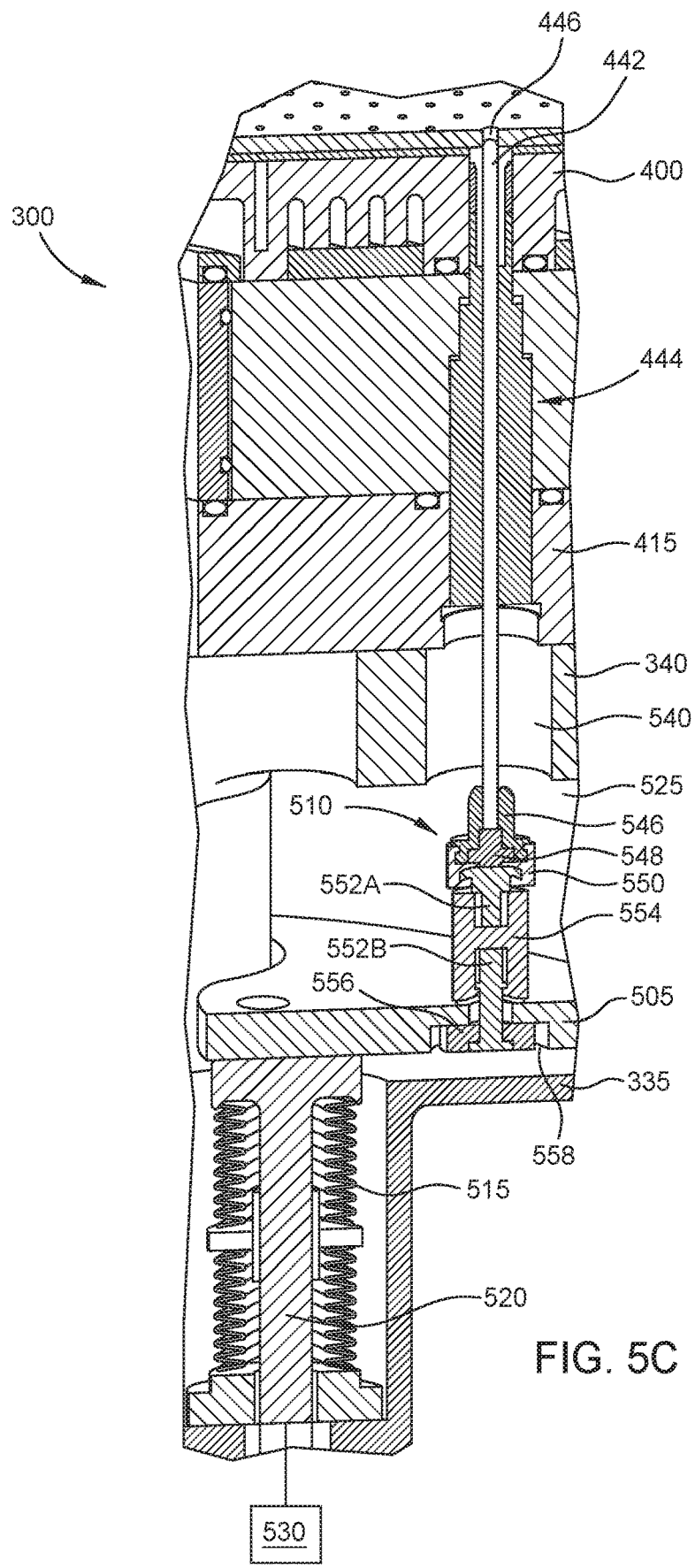
Figure 5D:
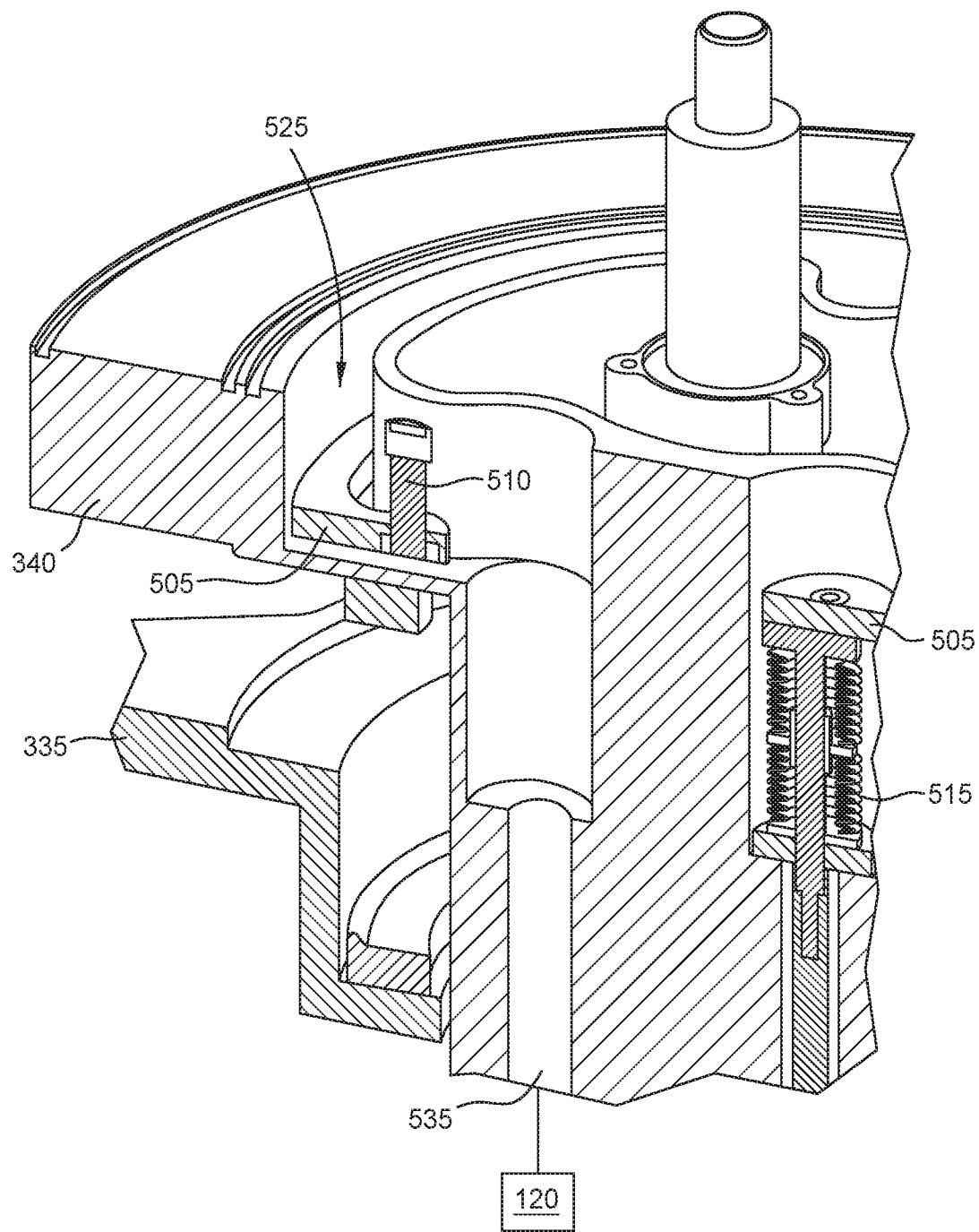

FIGS. 5A-5D are various views of a portion of the support structure 335 and the cathode assembly 300. FIG. 5A is a perspective view showing the base ring 340 above the support structure 335. FIG. 5B shows a lift pin spider 500 that interfaces with the base ring 340 and the support structure 335. FIG. 5C is an enlarged partial sectional view of the cathode assembly 300 having the lift pin spider 500 assembled therein. FIG. 5D is another enlarged partial sectional view of the cathode assembly 300 with the lift pin spider 500 assembled therein.

As shown in FIG. 5A and FIG. 5B, the lift pin spider 500 includes a ring body 505 (shown in FIG. 5B) having a pin grip device 510 coupled thereto. Each pin grip device 510 supports a lift pin 442 (shown in FIG. 5B). The lift pin spider 500 also includes a bellows 515 housing a lift shaft 520 (both shown in FIGS. 5B-5D). The ring body 505 includes a circular or generally circular outer edge 560, and inner edge 561. The inner edge 561 is circular, and includes one or more lobes (two minor lobes 562 and one major lobe 563, which is greater in size than the minor lobes 562, is shown). The lobes 562, 563 are spaced at about equal angular distances from one another (such as about 120 degrees), and include a lift pin attached thereto. In addition. The lift shaft 520 is coupled to the major lobe 563, on a side opposite a respective lift pin 442. In such an example, the lift shaft 520 and the respective lift pin are axially aligned, but other configurations are also contemplated.

The ring body 505 is adapted to fit and move vertically (in the Z direction) in a vacuum channel 525 (shown in FIGS. 5A, 5C and 5D). The vertical movement of the ring body 505 is provided by an actuator 530 (shown in FIG. 5C) to lift and lower the lift pins 442 coupled to the pin grip devices 510. The vacuum channel 525 is in fluid communication with the variable pressure system 120 via one or more vacuum conduits 535 (shown in FIGS. 5A and 5D). In this manner, conductance paths are formed around the lift pins 442 via the openings 446 in the dielectric bushings 444.

Referring to FIG. 5C, the lift pins 442 extend from the pin grip device 510 to the dielectric bushing 444 through openings 540 formed in the base ring 340.

Each pin grip device 510 includes a gripper 546, a gripper stem 548 and a gripper housing 550. The gripper housing 550 is coupled to a first fastener 552A that couples the gripper housing 550 to a standoff 554. A second fastener 552B couples the standoff 554 to the ring body 505. A fastener plate 556 secures the second fastener 552B to the ring body 505. The fastener plate 556 and the second fastener 552B are positioned in a recess 558 formed in a lower surface of the ring body 505.

The gripper housing 550, the first fastener 552A, the second fastener 552B, the fastener plate 556 and the bellows 515 are fabricated from a metallic material, such as stainless steel. The gripper 546, the gripper stem 548, the standoff 554 and the ring body 505 may be fabricated from a dielectric material, such as a polymer or a ceramic material. In a specific example, the gripper 546 and the gripper stem 548 may be made of a plastic material, such as polyimide plastic material. The standoff 554 may be made from a PEEK material. The ring body 505 may be made from aluminum oxide ($Al_2O_3$). Any metallic materials in or on the ring body 505 and the pin grip device 510 are grounded or electrically floating during operation of the cathode assembly 300.

Figure 6A:
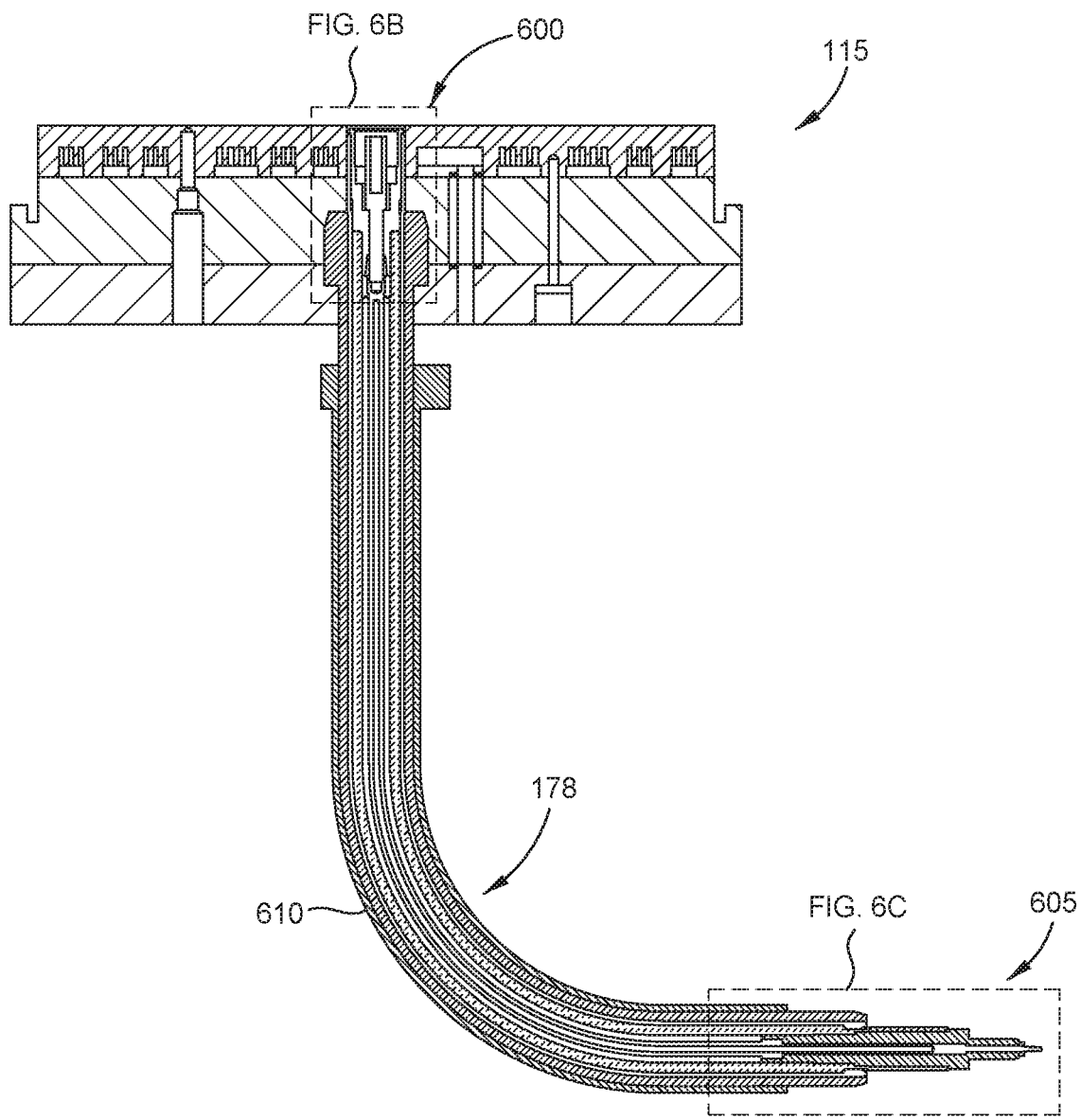
FIGS. 6A-6C are various sectional views of the facilities cable according to an embodiment.
Figure 6B:
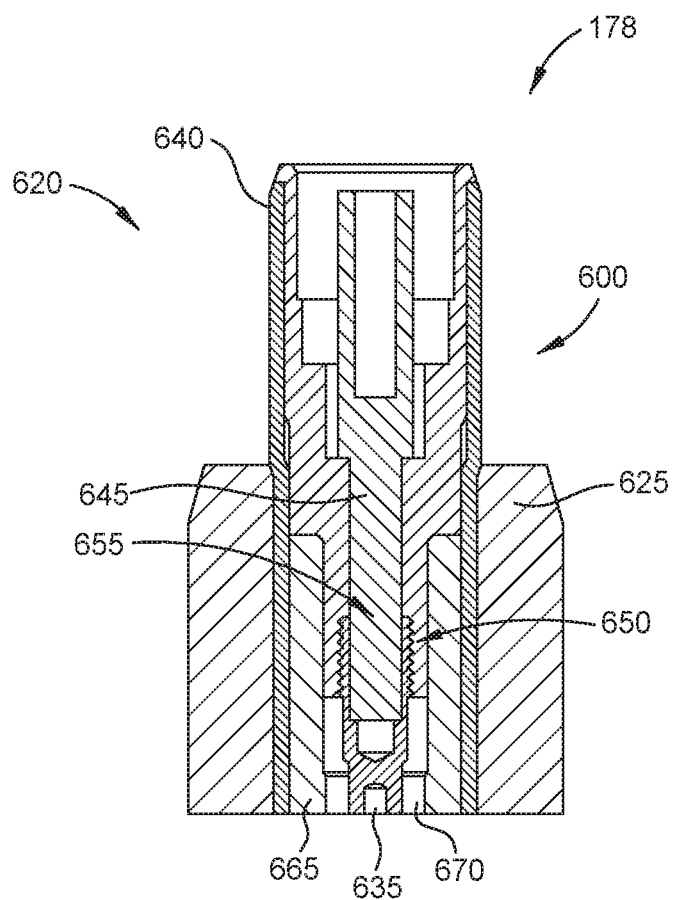
Figure 6C:
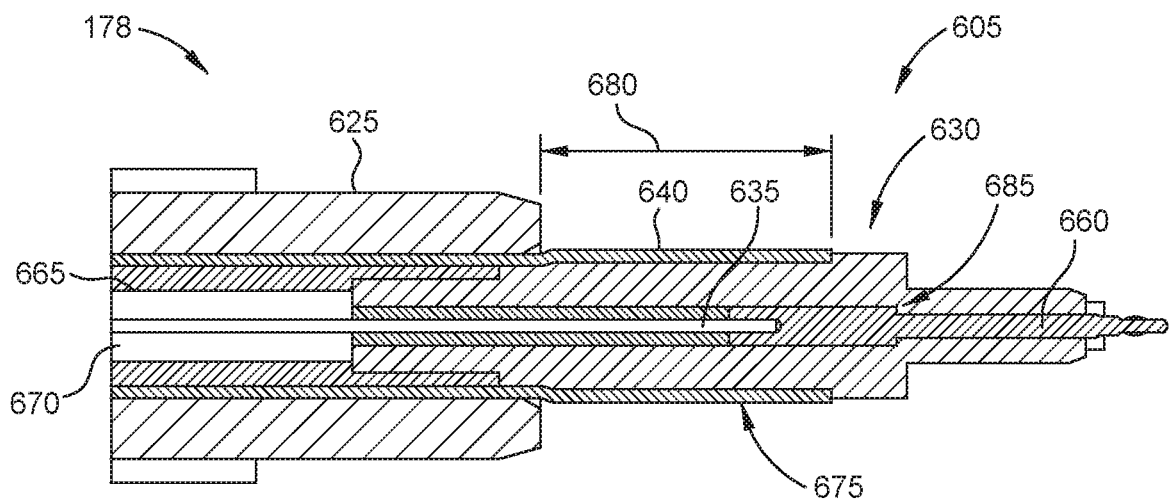

FIGS. 6A-6C are various sectional views of the facilities cable 178. The facilities cable 178 includes a first end 600 and a second end 605. The first end 600 interfaces with the substrate support 115 and the second end 605 interfaces with the facilities interface 310 (shown in FIGS. 3A and 3B).

The facilities cable 178 is a single piece conductor (i.e., a single unit or monolith). The facilities cable 178 according to this embodiment is an improvement over conventional cables. For example, the facilities cable 178 includes a bend 610 (e.g., a curved or arcuate section) where conventional conductors would have an L-shaped or 90 degree connection of two conductors. The bend 610 eliminates arcing at the conventional 90 degree connection, and improves current flow along the conductor. The single piece design also provides more robust insulation while also having a smaller outside diameter as compared to a conventional conductor. In some examples, the facilities cable 178 is fabricated in a bent shape, which maximizes contact between the composite layers of the facilities cable 178, as opposed to forming a linear facilities cable 178 and thereafter bending. Fabricating the facilities cable 178 in pre-bent shape avoids wrinkling of material that can occur around a bend when curving a linearly-formed cable. Such wrinkling can inadvertently increase resistance or induce arcing. As mentioned above, the facilities cable 178, based on actuation of the actuator 175 (shown in FIG. 1), flexes which provides vertical movement of the substrate support 115.

FIG. 6B is a sectional view of the first end 600 of the facilities cable 178. The first end 600 includes a connector 620 extending from a dielectric sheath 625. FIG. 6B is a sectional view of the second end 605 of the facilities cable 178. The second end 605 also includes a connector 630 extending from the dielectric sheath 625.

The connector 620 and the connector 630 include a first conductor 635 located centrally within the dielectric sheath 625. The dielectric sheath 625 does not extend to a terminus of end 620 of the facilities cable 178 to allow coupling with a substrate support 115. The connector 620 and the connector 630 also include a second conductor 640 that substantially surrounds the first conductor 635.

Referring to the connector 620, the first conductor 635 is connected to a socket 645 that is coupled to the first conductor 635 by a conductive housing 650. The socket 645 and the conductive housing 650 include a threaded connection 655. Referring to the connector 630, the first conductor 635 is coupled to a male insert 660.

The first conductor 635 and the second conductor 640 are electrically separated by one or both of a dielectric material 665 and a space or gap 670. The dielectric material 665 may be a polymeric material, such as PEEK, PTFE, or other polymeric and/or electrically insulative materials. Both of the first conductor 635, the second conductor 640, the socket 645, the conductive housing 650 and the male insert 660 are made of an electrically conductive metal, such as copper. At the bend 610, thinning of the second conductor 640 and collapse of the dielectric material 665 (i.e., distortion of the facilities cable 178) may cause a separation of the dielectric material 665 from the second conductor 640. The separation may result in arcing at the bend 610. Pretreatment, such as stress relieving and/or annealing, of the pre-bent facilities cable 178 at the bend 610 eliminates possible distortion of the facilities cable 178 due to potential thinning of the second conductor 640 and collapse of the dielectric material 665.

The construction of the facilities cable 178 as described herein provides an exposed interface surface 675 of the second conductor 640 that includes a length 680 greater than a length of conventional conductors. Additionally, the construction of the facilities cable 178 as described herein provides a shoulder region or stop 685 for the male insert 660.

Figure 7:
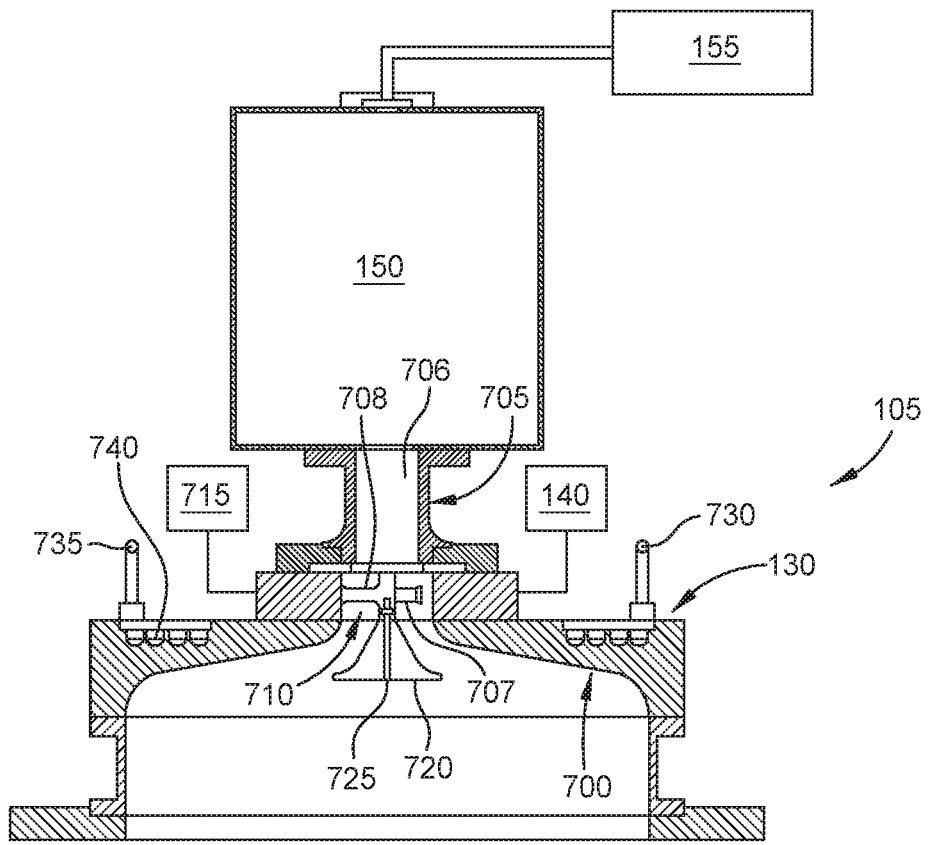
FIG. 7 is a schematic sectional view of a lid assembly according to an embodiment.

FIG. 7 is a schematic sectional view of another embodiment of the lid assembly 105. The lid assembly 105 according to this embodiment includes a dome structure 700 formed in a portion of the heat exchanger 130. The dome structure 700 is coupled to the remote plasma source 150 by a flange 705 having an opening 706 formed axially therethrough to facilitate flow of plasma through the flange 705. The dome structure 700 is also coupled to a gas distribution assembly 710.

The gas distribution assembly 710 includes the first processing gas source 140 and a purge gas source 715. Both of the first processing gas source 140 and the purge gas source 715 are coupled to the gas distribution assembly 710 by valves (not shown). The gas distribution assembly 710 also includes a baffle plate 720. The baffle plate 720 is utilized to spread excited cleaning gases from the remote plasma source 150. The baffle plate 720 is coupled to an internal surface 707 of the gas distribution assembly 710 by one or more brackets 708. The brackets 708 are spaced at equal angular distances (such as three brackets spaced at 120 degrees) in a spoke-and-hub configuration. The baffle plate 720 also includes a central opening 725. The central opening 725 may be utilized to deliver one or both of the processing gases and the purge gases from the respective sources.

The heat exchanger 130 includes an inlet 730 and an outlet 735. Heat exchanging fluids flow from the inlet 730, through channels 740 formed in the dome structure 700, and out of the outlet 735.

While the foregoing is directed to embodiments of the present disclosure, other and further embodiments of the disclosure can be devised without departing from the basic scope thereof, and the scope thereof is determined by the claims that follow.

The invention claimed is:

1. A process chamber, comprising:
    a lid assembly;
    a chamber body coupled to the lid assembly by a spacer, the spacer and the chamber body defining a resonance cavity, the chamber body sealed to the spacer by an O-ring, wherein the spacer includes a liner surrounding the resonance cavity, wherein the liner has a cylindrical wall, and wherein an upper portion of the cylindrical wall has a greater thickness than a lower portion of the cylindrical wall;
    a rotatable magnet assembly coupled to the spacer outside of the resonance cavity; and a substrate support disposed and movable within the resonance cavity, wherein the substrate support is coupled to a facilities cable that flexes based on operation of an actuator coupled to the substrate support.

2. The process chamber of claim 1, wherein the lid assembly comprises a heat exchanger.

3. The process chamber of claim 1, wherein the spacer includes a plurality of heater elements.

4. The process chamber of claim 1, wherein the rotatable magnet assembly comprises a plurality of magnets coupled to a magnet actuator.

5. The process chamber of claim 1, further comprising a variable pressure system coupled to the chamber body.

6. The process chamber of claim 5, wherein the variable pressure system comprises a first pump and a second pump.

7. The process chamber of claim 1, wherein the facilities cable comprises a single piece conductor.

8. A process chamber, comprising:
a lid assembly comprising a showerhead;
a chamber body coupled to the lid assembly by a spacer, the spacer and the chamber body defining a resonance cavity, the chamber body sealed to the spacer by an O-ring;
a liner disposed within an inner diameter of the spacer, wherein the liner has a cylindrical wall, and wherein an upper portion of the cylindrical wall has a greater thickness than a lower portion of the cylindrical wall;
a magnet assembly coupled to the spacer outside of the resonance cavity; and
a substrate support disposed within the resonance cavity, wherein the substrate support is coupled to a facilities cable and comprises an electrostatic chuck having a puck including a plurality of electrodes.

9. The process chamber of claim 8, wherein the facilities cable comprises a single piece conductor.

10. The process chamber of claim 8, wherein the spacer includes a plurality of heater elements.

11. The process chamber of claim 8, wherein the magnet assembly comprises a plurality of magnets coupled to a magnet actuator configured to move each of the magnets vertically relative to a height of the resonance cavity.

12. A process chamber, comprising:
a lid assembly comprising a showerhead;
a chamber body coupled to the lid assembly by a spacer, the spacer and the chamber body defining a resonance cavity, the chamber body sealed to the spacer by an O-ring, wherein the spacer includes a liner surrounding the resonance cavity, wherein the liner has a cylindrical wall, and wherein an upper portion of the cylindrical wall has a greater thickness than a lower portion of the cylindrical wall;
a magnet assembly coupled to the spacer outside of the resonance cavity; and
a substrate support movably disposed within the resonance cavity, wherein the substrate support is coupled to a facilities cable that includes a single piece conductor including a bend, and wherein the substrate support comprises an electrostatic chuck having a puck including a plurality of electrodes.

13. The process chamber of claim 12, wherein the spacer includes a plurality of heater elements.

14. The process chamber of claim 12, wherein the magnet assembly comprises a plurality of magnets coupled to a magnet actuator configured to move each of the magnets vertically relative to a height of the resonance cavity.

* * * * *